(12) United States Patent
Sun et al.

(10) Patent No.: US 8,448,694 B2
(45) Date of Patent: May 28, 2013

(54) HEAT DISSIPATION ASSEMBLY

(75) Inventors: Zheng-Heng Sun, Taipei Hsien (TW); Xina-Xiu Tang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 471 days.

(21) Appl. No.: 12/760,560

(22) Filed: Apr. 15, 2010

(65) Prior Publication Data

US 2011/0094713 A1   Apr. 28, 2011

(30) Foreign Application Priority Data

Oct. 28, 2009 (CN) .......................... 2009 1 0308954

(51) Int. Cl.
*F28F 7/00* (2006.01)
*H05K 7/20* (2006.01)

(52) U.S. Cl.
USPC ..................................... 165/80.3; 165/104.21

(58) Field of Classification Search
CPC ............................ H01L 23/467; H01L 23/427
USPC ...... 165/80.3, 104.21, 104.34, 121; 361/700, 361/695, 697, 679.47, 679.52; 257/715
See application file for complete search history.

(56) References Cited

U.S. PATENT DOCUMENTS

| | | | |
|---|---|---|---|
| 7,089,999 B1 * | 8/2006 | Wu et al. ....................... | 165/80.3 |
| 7,130,192 B2 * | 10/2006 | Wang et al. .................... | 361/697 |
| 7,286,353 B2 * | 10/2007 | Yu et al. ......................... | 361/697 |
| 7,551,447 B2 * | 6/2009 | Li et al. ......................... | 361/719 |
| 8,047,270 B2 * | 11/2011 | Xu ............................ | 165/104.33 |
| 2003/0230398 A1 * | 12/2003 | Lee et al. .................. | 165/104.21 |
| 2004/0257770 A1 * | 12/2004 | Hu ................................ | 361/704 |
| 2005/0139347 A1 * | 6/2005 | Chen et al. ............... | 165/104.33 |
| 2010/0252239 A1 * | 10/2010 | Li et al. ..................... | 165/104.26 |

* cited by examiner

Primary Examiner — Tho V Duong
(74) Attorney, Agent, or Firm — Altis Law Group, Inc.

(57) ABSTRACT

A heat dissipation assembly includes a fixing board defining a fixing groove, a heat sink device fixed to the fixing board, a fan housing assembly fixed to the heat sink device, and a heat dissipation pipe. The heat sink device defines a first receiving groove aligning with the fixing groove, and a second receiving groove opposite to the first receiving groove. The fan housing assembly includes a frame defining a slot aligning with the second receiving groove, and a fan received in the frame. The dissipation pipe includes a first pipe portion, a second pipe portion, and an arc-shaped connecting portion connecting the first and second pipe portions. The first pipe portion is accommodated in the fixing groove and the first receiving groove. The second pipe portion is accommodated in the second receiving groove and the slot.

8 Claims, 3 Drawing Sheets

HEAT DISSIPATION ASSEMBLY

BACKGROUND

1. Technical Field

The disclosure relates to heat dissipation assemblies, and particularly to a heat dissipation assembly that readily dissipates heat generated by a microprocessor used in a computer system.

2. Description of Related Art

Devices, such as a microprocessor, used in a computer system, radiate very large amount of heat, which increases the operating temperature of the devices. In cases that the heat increases severely, the devices may overheat to the point that it influences data processing speed and efficiency, or can even cause permanent damage.

DETAILED DESCRIPTION

Figure 1:
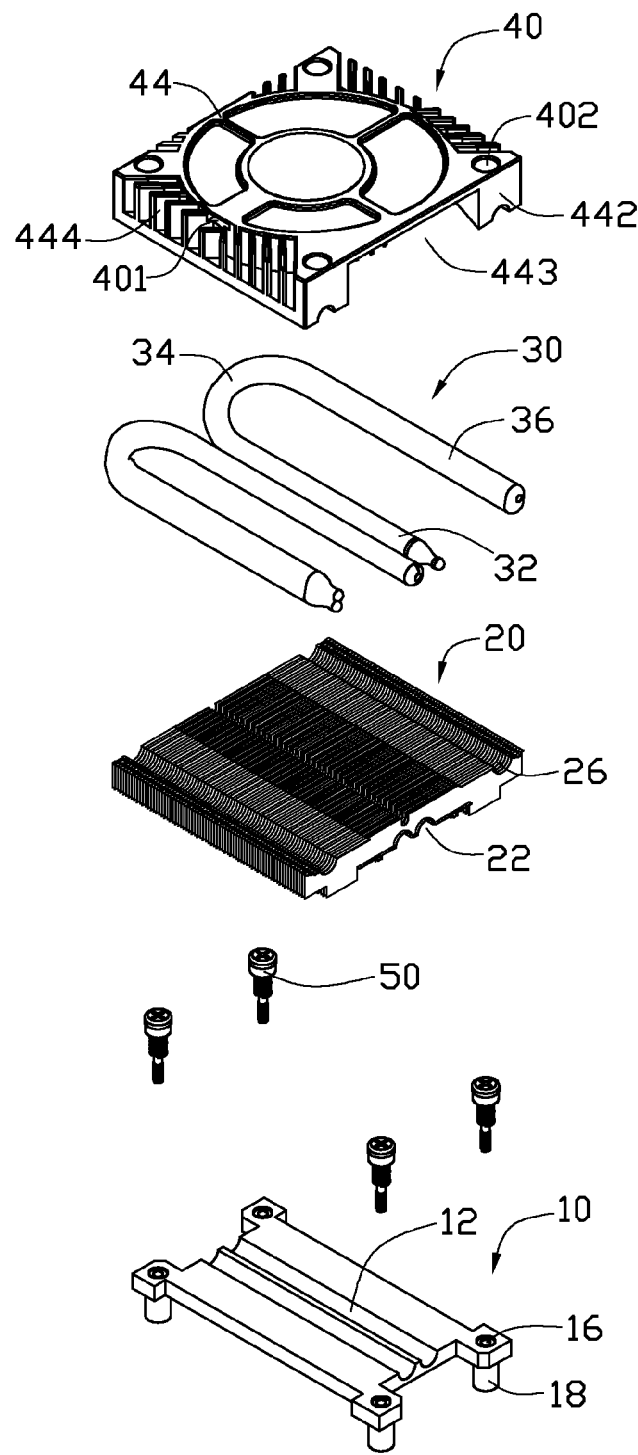
FIG. 1 is an exploded, isometric view of an exemplary embodiment of a heat dissipation assembly.
Figure 2:
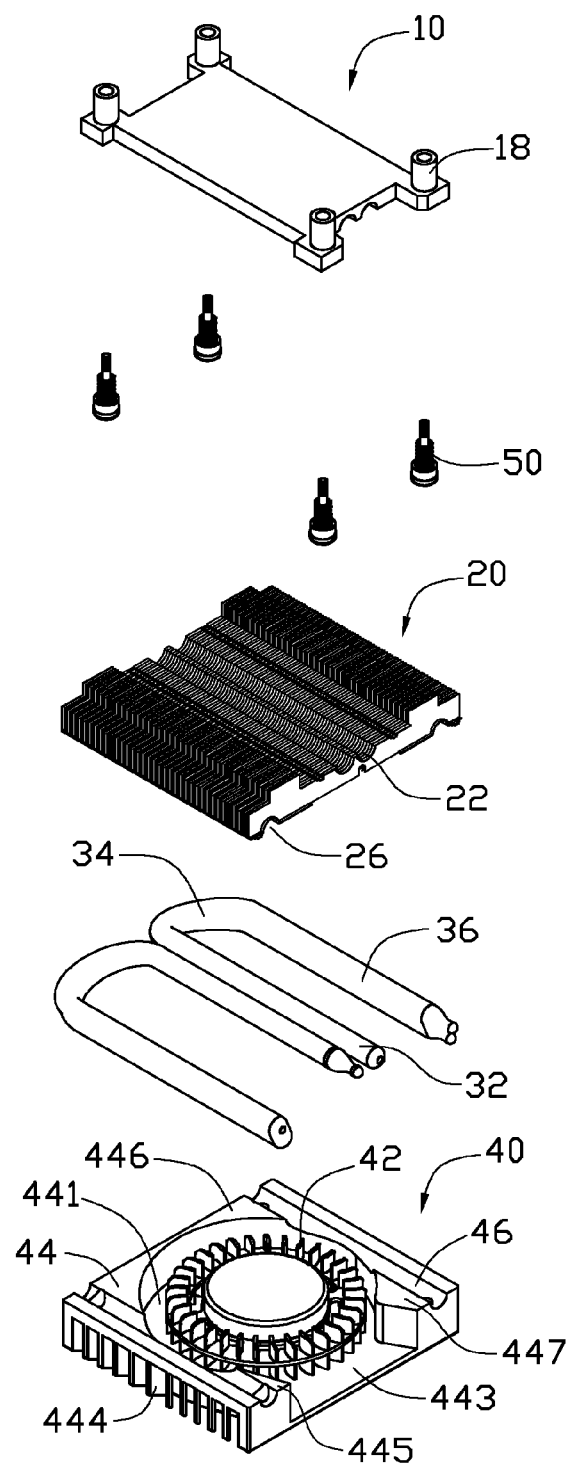
FIG. 2 is an inverted view of the heat dissipation assembly of FIG. 1.

Referring to FIGS. 1 and 2, an exemplary embodiment of a heat dissipation assembly includes a fixing board 10, a heat sink device 20, first and second U-shaped dissipation pipes 30, a fan housing assembly 40, and four fasteners 50. In this embodiment, the fasteners 50 are bolts.

The fixing board 10 defines two parallel fixing grooves 12 transversely extending through the fixing board 10, the fixing grooves 12 are adjacent to each other. Four fixing posts 18 extend from four corners of the fixing board 10, opposite to the fixing grooves 12. Four through holes 16 are defined in the corners of the fixing board 10, and extend through the fixing posts 18, respectively.

The heat sink device 20 includes a plurality of parallel fins (not labeled). The heat sink device 20 defines two arc-shaped first receiving grooves 22 in a first surface of the heat sink device 20. The first receiving grooves 22 transversely extend through the first surface of the heat sink device 20, respectively, and adjacent to each other. The heat sink device 20 defines two arc-shaped second receiving grooves 26 in a second surface of the heat sink device 20, opposite to the first surface of the heat sink device 20. The second receiving grooves 26 transversely extend through the second surface of the heat sink device 20, and situate at opposite ends of the second surface of the heat sink device 20, respectively.

Each of the first and second dissipation pipes 30 is U-shaped and includes a first pipe portion 32, a second pipe portion 36 parallel to the first pipe portion 32, and an arc-shaped connecting portion 34 connecting the first and second pipe portions 32 and 34.

The fan housing assembly 40 includes a fan 42, and a frame 44 for mounting the fan 42. The frame 44 is generally rectangular, which defines a receiving dish 441 for receiving the fan 42. The receiving dish 441 extends through a first end 442 of the frame 44 to form an air vent 443. Hence, the receiving dish 441 and the air vent 443 combine to form a generally U-shaped depressing portion bounding by a side protrusion 446 opposite to the air vent 443, and two sidewalls 447 and 445 perpendicularly connecting to opposite ends of the side protrusion 446. Outer sides of the side protrusion 446 and the sidewalls 447 and 445 form a plurality of fins 444. Gaps (not labeled) between adjacent fins 444 communicate with the receiving dish 441, so that air can flow into the receiving dish 441 through the gaps. The sidewalls 445 and 447 each transversely define an arc-shaped slot 46. A middle of each slot 46 communicates with the receiving dish 441. The frame 44 further defines four air holes 402 in four corners, communicating with the corresponding slots 46, for allowing air to pass therethrough. In addition, the sidewall 447 defies a through hole 401, thereby, a wire extends through the through hole 401 to connect to the fan 42, to provide power to the fan 42.

Figure 3:
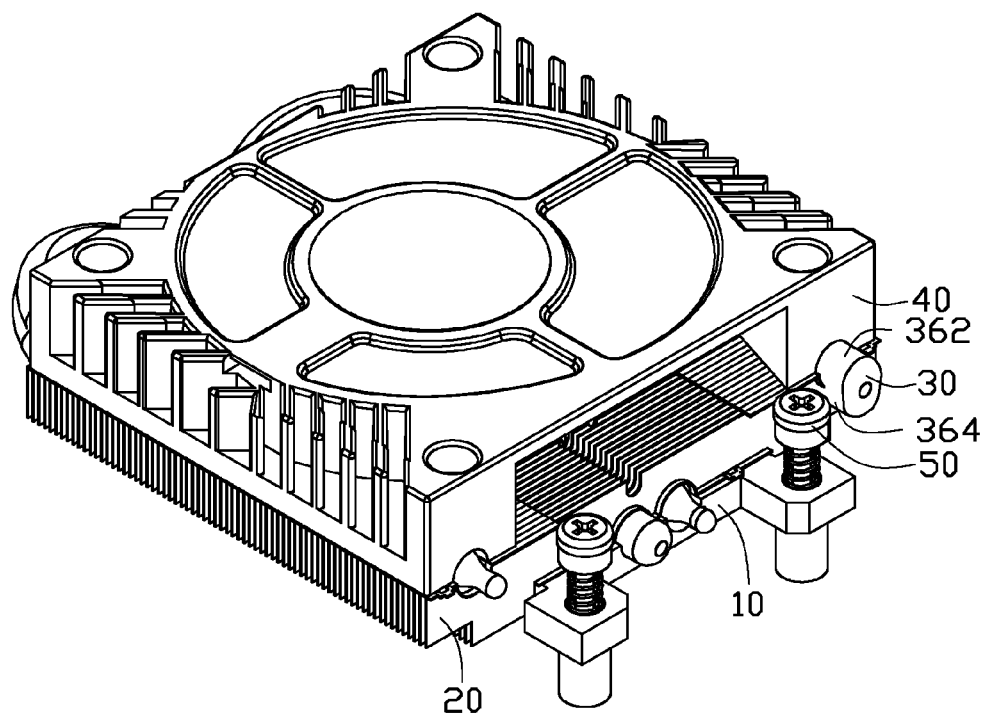
FIG. 3 is an assembled, isometric view of the dissipation assembly of FIG. 1.

Referring to FIG. 3, in assembly, the fixing board 10 covers a heat generating component (not shown), such as a central processing unit, with the fixing grooves 12 opposite to the heat generating component. The plurality of fasteners 50 extend through the through holes 16 of the fixing board 10, and then connect to a component, such as a motherboard for mounting the heat generating component, to fix the fixing board 10 to the heat generating component.

The first pipe portion 32 of the first dissipation pipe 30, and the second pipe portion 36 of the second dissipation pipe 30 are received in the fixing grooves 12 correspondingly. The heat sink device 20 is mounted on the fixing board 10, with the first receiving grooves 22 aligning with the corresponding fixing grooves 12. As a result, the first pipe portion 32 of the first dissipation pipe 30 and the second pipe portion 36 of the second dissipation pipe 30 are accommodated in the fixing grooves 12 and the first receiving grooves 22. The second pipe portion 36 of the first dissipation pipe 30, and the first pipe portion 32 of the second dissipation pipe 30 are located above the heat sink device 20 to be received in the second receiving grooves 26 correspondingly. Thereafter, the fan housing assembly 40 is fixed to the heat sink device 20, with the slots 46 aligning with the second receiving grooves 26. Therefore, the second pipe portion 36 of the first dissipation pipe 30, and the first pipe portion 32 of the second dissipation pipe 30 are accommodated in the slots 46 and the second receiving grooves 16 correspondingly. The second pipe 36 of the first dissipation pipe 30, and the first pipe portion 32 of the second dissipation pipe 30 respectively includes a lower portion 364 contactingly engaged in the second receiving groove 26 and an upper portion 362 contactingly engaged in the slot 46. The heat can be conducted to the frame through the heat sink and the second pipe portion. The fan 42 of the fan housing assembly 40 faces the heat sink device 20. Cool air can flow into the heat sink device 20 through the air vent 443 and the air holes 402, which assists in heat dissipation. Afterwards, the fan 42 can dissipate heated air.

Obviously, in another embodiment, the heat dissipation assembly can include one dissipation pipe 30 or more than two dissipation pipes 30.

It is believed that the present embodiments and their advantages will be understood from the foregoing description, and they will be apparent that various changes may be made thereto without departing from the spirit and scope of the description or sacrificing all of its material advantages, the examples hereinbefore described merely being exemplary embodiments.

What is claimed is:

1. A heat dissipation assembly comprising:
   a fixing board defining at least one fixing groove; and
   a heat sink device fixed to the fixing board, the heat sink device defining at least one first receiving groove aligning with the fixing groove in a first surface of the heat sink device, and at least one second receiving groove defined in a second surface of the heat sink device, opposite to the first surface;

a fan housing assembly fixed to the heat sink device, opposite to the fixing board, the fan housing assembly comprising a fan and a frame receiving the fan, the frame defining at least one slot aligning with the second receiving groove; and at least one substantially U-shaped dissipation pipe, comprising a first pipe portion, a second pipe portion, and an arc-shaped connecting portion connecting the first and second pipe portions;

wherein the first pipe portion is accommodated in the fixing groove and the first receiving groove, and the second pipe portion is accommodated in the second receiving groove and the slot, with a lower portion of the second pipe portion contactingly engaged in the second receiving groove and an upper portion of the second pipe portion contactingly engaged in the slot, such that heat is conducted to the frame through the heat sink and the second pipe portion;

wherein the frame defines a receiving dish for receiving the fan, the receiving dish extends through a first end of the frame to form an air vent communicating with the receiving dish;

wherein the at least one slot is defined in the frame, located at one of opposite sidewalls bounding the receiving dish, the frame further defines at least one air hole communicating with the receiving dish; and wherein outer sides of a second end of the frame opposite to the air vent and the sidewalls correspondingly form a plurality of fins, gaps between the adjacent fins communicating with the receiving dish.

2. The heat dissipation assembly of claim 1, wherein a middle of the at least one slot communicates with the receiving dish.

3. A heat dissipation assembly comprising:
a fixing board;
a heat sink device fixed to the fixing board;
a substantially U-shaped dissipation pipe, comprising a first pipe portion, a second pipe portion, and a connecting portion connecting the first and second pipe portions; and
a fan housing assembly fixed to the heat sink device, opposite to the fixing board, the fan housing assembly comprising a fan and a frame, the frame defining a receiving dish for receiving the fan, and at least one air hole communicating with the receiving dish, the receiving dish extending through a first end of the frame to form an air vent communicating with the receiving dish, outer sides of a second end of the frame opposite to the air vent, and two sidewalls bounding the receiving dish of the frame forming a plurality of fins;
wherein the first pipe portion is mounted between the fixing board and the heat sink device, and the second pipe portion is mounted between the frame and the heat sink device, cool air is capable of flowing into the receiving dish to cool the second pipe portion through the air vent and the at least one air hole, and then the fan can dissipate heated air.

4. The heat dissipation assembly of claim 3, wherein the fixing board defines a fixing groove, the heat sink device defines a first receiving groove aligning the fixing groove, the first pipe portion is accommodated in the fixing groove and the first receiving groove.

5. The heat dissipation assembly of claim 4, wherein the heat sink device defines a second receiving groove opposite to the first receiving groove, one of the sidewalls of the frame defines a slot, the second pipe portion is accommodated in the slot and the second receiving groove.

6. The heat dissipation assembly of claim 5, wherein the sidewalls of the frame extends from opposite ends of the second end of the frame.

7. The heat dissipation assembly of claim 5, wherein the at least one air hole communicates with the slot, and a middle of the slot communicates with the receiving dish.

8. A heat dissipation assembly comprising:
a fixing board defining at least one fixing groove; and
a heat sink device fixed to the fixing board, the heat sink device defining at least one first receiving groove aligning with the fixing groove in a first surface of the heat sink device, and at least one second receiving groove defined in a second surface of the heat sink device, opposite to the first surface;
a fan housing assembly fixed to the heat sink device, opposite to the fixing board, the fan housing assembly comprising a fan and a frame receiving the fan, the frame defining at least one slot aligning with the second receiving groove; and
at least one substantially U-shaped dissipation pipe, comprising a first pipe portion, a second pipe portion, and an arc-shaped connecting portion connecting the first and second pipe portions;
wherein the first pipe portion is accommodated in the fixing groove and the first receiving groove, and the second pipe portion is accommodated in the second receiving groove and the slot, with a lower portion of the second pipe portion contactingly engaged in the second receiving groove and an upper portion of the second pipe portion contactingly engaged in the slot, such that heat is conducted to the frame through the heat sink and the second pipe portion; and
wherein four fixing posts extend from the fixing board, opposite to the at least one fixing groove, and the fixing board further defines four through holes extend through the fixing posts.

* * * * *